US012635500B2

(12) United States Patent
Shih et al.

(10) Patent No.: US 12,635,500 B2
(45) Date of Patent: May 19, 2026

(54) SEMICONDUCTOR DEVICE AND METHOD HAVING HIGH-KAPPA BONDING LAYER

(71) Applicant: Taiwan Semiconductor Manufacturing Co., Ltd., Hsinchu (TW)

(72) Inventors: Che Chi Shih, Hsinchu (TW); Cheng-Ting Chung, Hsinchu (TW); Han-Yu Lin, Hsinchu (TW); Wei-Yen Woon, Hsinchu (TW); Szuya Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 528 days.

(21) Appl. No.: 18/151,160

(22) Filed: Jan. 6, 2023

(65) Prior Publication Data

US 2023/0317674 A1     Oct. 5, 2023

Related U.S. Application Data

(60) Provisional application No. 63/413,936, filed on Oct. 6, 2022, provisional application No. 63/324,962, filed on Mar. 29, 2022.

(51) Int. Cl.
| | |
|---|---|
| *H01L 23/373* | (2006.01) |
| *H01L 23/00* | (2006.01) |
| *H01L 23/522* | (2006.01) |
| *H01L 23/528* | (2006.01) |

(52) U.S. Cl.
CPC .......... *H01L 24/73* (2013.01); *H01L 23/3735* (2013.01); *H01L 23/5226* (2013.01); *H01L 23/5283* (2013.01); *H01L 2224/73251* (2013.01)

(58) Field of Classification Search
CPC . H01L 24/73; H01L 23/3735; H01L 23/5226; H01L 23/5283; H01L 2224/73251
USPC ........................................................ 257/774
See application file for complete search history.

(56) References Cited

U.S. PATENT DOCUMENTS

2022/0028752 A1 * 1/2022 Huang ................... H10D 30/43

FOREIGN PATENT DOCUMENTS

TW        202205382 A        2/2022
TW        202209561 A        3/2022

* cited by examiner

*Primary Examiner* — Tu-Tu V Ho
(74) *Attorney, Agent, or Firm* — Seed IP Law Group

(57)        ABSTRACT

Semiconductor devices and methods are provided which facilitate improved thermal conductivity using a high-kappa dielectric bonding layer. In at least one example, a device is provided that includes a first substrate. A semiconductor device layer is disposed on the first substrate, and the semiconductor device layer includes one or more semiconductor devices. Frontside interconnect structure are disposed on the semiconductor device layer, and a bonding layer is disposed on the frontside interconnect structure. A second substrate is disposed on the bonding layer. The bonding layer has a thermal conductivity greater than 10 W/m-K.

21 Claims, 13 Drawing Sheets

200

100

300

102
104
108
110
202

500

102
104
108
110
106
124

700

800

302
202

303
301
108
110
202

303
302
102

SEMICONDUCTOR DEVICE AND METHOD HAVING HIGH-KAPPA BONDING LAYER

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
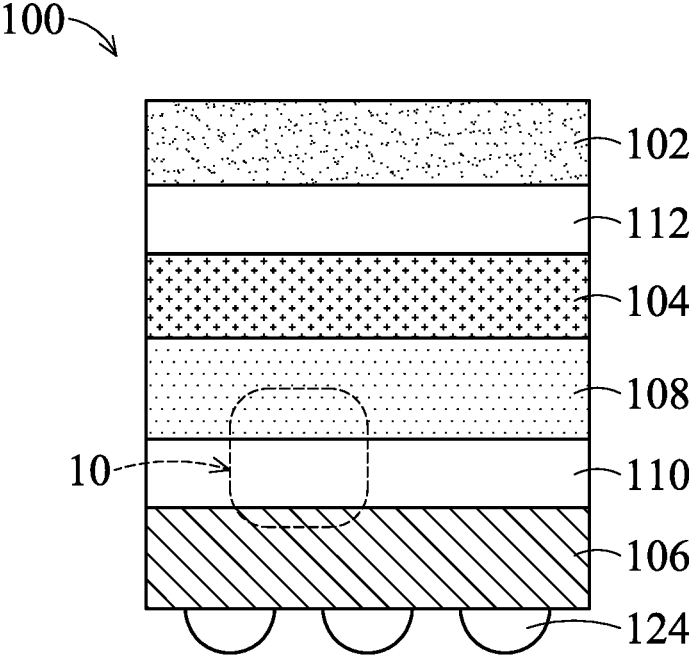
FIG. 1A is a cross-sectional diagram illustrating a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provided herein include semiconductor devices and methods which facilitate improved thermal conductivity, thereby reducing or preventing thermal degradation of the semiconductor devices. Thermal conductivity is improved due to the presence of a high-kappa dielectric bonding layer that is used during processing of the devices, e.g., to bond a device wafer to a carrier wafer. The high-kappa dielectric bonding layer may have a thermal conductivity that is greater than a thermal conductivity of silicon dioxide, thus improving the thermal conductivity of the bonding layer. In some embodiments, the bonding layer is a high-kappa dielectric layer having a thermal conductivity that is greater than 10 W/m·K.

FIG. 1A is a cross-sectional diagram illustrating a semiconductor device 100, in accordance with some embodiments of the present disclosure. The semiconductor device 100 may be any semiconductor device, such as, but not limited to, a logic device, a memory device, or any other semiconductor device. As shown in FIG. 1A, the device 100 includes an optional substrate 102, a bonding layer 104, a backside interconnection structure 106, and a semiconductor device layer 110. In some embodiments, the device 100 may be a semiconductor device package.

The substrate 102 may be any suitable substrate. In some embodiments, the substrate 102 may be a semiconductor wafer. In some embodiments, the substrate 102 may be a monocrystalline silicon (Si) wafer, an amorphous Si wafer, a gallium arsenide (GaAs) wafer, or any other semiconductor wafer. In some embodiments, the substrate 102 may be a carrier wafer, which may be substantially free of electrical features and may be utilized to bond to the device 100 (e.g., bonded to the backside interconnection structure 106 and semiconductor device layer 110) during processing of the device 100.

The semiconductor device layer 110 includes one or more semiconductor devices. The semiconductor devices included within the semiconductor device layer 110 may be any semiconductor devices in various embodiments. In some embodiments, the semiconductor device layer 110 includes one or more transistors, which may include any suitable transistor structures, including, for example, FinFET, gate-all-around (GAA) transistors, or the like. In some embodiments, the semiconductor device layer 110 includes one or more GAA transistors. In some embodiments, the semiconductor device layer 110 may be a logic layer that includes one or more semiconductor devices, and may further include their interconnection structures, that are configured and arranged to provide a logical function, such as AND, OR, XOR, XNOR, or NOT, or a storage function, such as a flipflop or a latch.

In some embodiments, the semiconductor device layer 110 may include a memory device, which may be any suitable memory device, such as, for example, a static random access memory (SRAM) device. The memory device may include a plurality of memory cells that are constructed in rows and columns, although other embodiments are not limited to this arrangement. Each memory cell may include multiple transistors (e.g., six) connected between a first voltage source (e.g., VDD) and a second voltage source (e.g., VSS or ground) such that one of two storage nodes can be occupied by the information to be stored, with the complementary information stored at the other storage node.

The semiconductor device layer 110 of the device 100 may further include various circuitry that is electrically coupled to the semiconductor device layer 110. For example, the semiconductor device layer 110 may include power management or other circuitry that is electrically coupled to the one or more semiconductor devices of the semiconductor device layer 110. The power management circuitry may include any suitable circuitry for controlling or otherwise managing communication signals, such as input power signals, to or from the semiconductor devices of the semiconductor device layer 110. In some embodiments, the power management circuitry may include power-gating circuitry which may reduce power consumption, for example, by shutting off the current to blocks of the circuit (e.g., blocks or electrical features in the semiconductor device layer 110) that are not in use, thereby reducing stand-by or leakage power. In some embodiments, the semiconductor device layer 110 includes one or more switching devices, such as a plurality of transistors, that are used to transmit or receive electrical signals to and from the semiconductor devices in the semiconductor device layer 110, such as to turn on and turn off the circuitry (e.g., transistors, etc.) of the semiconductor device layer 110.

The backside interconnection structure 106 is disposed at a backside of the semiconductor device layer 110, e.g., at the lower side as shown in FIG. 1A. The backside interconnection structure 106 may include any suitable electrical interconnection structures, circuitry, wiring, or the like suitable to receive or transmit electrical signals to and from the semiconductor device layer 110.

In some embodiments, the backside interconnection structure 106 includes a backside power rail. The backside power rail may be disposed, for example, between a backside power delivery network and backside vias which may electrically couple the backside power rail to the semiconductor devices in the semiconductor device layer 110.

In some embodiments, the backside power rail of the backside interconnection structure 106 may include a plurality of conductive lines or power rails which operably deliver or receive electrical signals (e.g., power or voltage signals) to or from the semiconductor devices in the semiconductor device layer 110. The backside power rail may be formed of any suitable conductive material. In some embodiments, the backside power rail is formed of or includes a metal.

In some embodiments, the backside interconnection structure 106 further includes frontside interconnect structure which may be electrically coupled to one another by one or more conductive vias. The metallization layers extend between electrical contacts 124 at the backside of the device 100 and the semiconductor device layer 110. In some embodiments, the metallization layers electrically the electrical contacts 124 to one or more semiconductor devices in the semiconductor device layer 110. The metallization layers may be electrically coupled to one another through one or more conductive vias.

The backside interconnection structure 106 may further include an insulation layer covering the various features, e.g., conductive features, of the backside interconnection structure 106. For example, an insulation layer may be included which covers or substantially covers the backside power rail, the backside vias, and the metallization layers of the backside interconnection structure 106. The insulation layer may be formed of any suitable insulation material, and in some embodiments, the insulation layer electrically insulates or isolates the various electrical features within the backside interconnection structure 106 from one another. In some embodiments, the insulation layer may be formed of a dielectric material, which may include one or more of silicon dioxide ($SiO_2$), SiON, SiOC and SiOCN or any other suitable insulating material. The insulation layer may be disposed on and in contact with the semiconductor device layer 110.

In some embodiments, the backside interconnection structure 106 has a thickness that is less than 10 μm. In some embodiments, the backside interconnection structure 106 has a thickness that is less than 5 μm, and in some embodiments, is within a range from 0.1 μm to 5 μm.

In some embodiments, the device 100 includes a frontside interconnect structure 108. In some embodiments, the frontside interconnect structure 108 has an overall thickness (e.g., between the semiconductor device layer 110 and the bonding layer 104) that is less than 10 μm. In some embodiments, the frontside interconnect structure 108 has an overall thickness that is less than 5 μm, and in some embodiments, is within a range from 0.1 μm to 5 μm. The frontside interconnect structure 108 may each include a dielectric layer having metallization features (e.g., vias, wires, traces or the like) embedded therein. The dielectric layers may be low-k dielectric layers, such as $SiO_2$, SiON, SiOC, SiOCN, or the like. The metallization features may be or include copper, tungsten, ruthenium, molybdenum, titanium, titanium nitride, other metals, alloys thereof, multilayer combinations thereof, or the like. The frontside interconnect structure 108 may be referred to as a frontside interconnect structure 108 or a frontside back-end-of-line (BEOL) structure 108.

The bonding layer 104 bonds the substrate 102 to the semiconductor device layer 110. In some embodiments, the bonding layer 104 bonds the substrate 102 to the frontside interconnect structure 108. The bonding layer 104 may be formed of any material to suitably bond the substrate 102 and the frontside interconnect structure 108 or the semiconductor device layer 110.

In some embodiments, the bonding layer 104 is a high-kappa dielectric layer formed of a high-kappa dielectric material. It should be understood that "high-kappa" refers to thermal conductivity (kappa) of material of the bonding layer 104 being higher than thermal conductivity of a selected material or selected thermal conductivity level. In some embodiments, the bonding layer 104 is a high-kappa dielectric layer having a thermal conductivity that is greater than a thermal conductivity of silicon dioxide. In some embodiments, the bonding layer 104 is a high-kappa dielectric layer having a thermal conductivity that is greater than 10 W/m·K. In some embodiments, the bonding layer 104 is a high-kappa dielectric layer including one or more of a nitride, a metal oxide, or a carbide. In some embodiments, the bonding layer 104 includes one or more of AlN, BN, $Y_2O_3$, YAG, $Al_2O_3$, BeO, SiC, graphene, or any other suitable high-kappa material.

In various embodiments, the high-kappa materials of the bonding layer 104 may be arranged in any suitable crystal structure, including, for example, cubic, hexagonal, tetragonal, orthorhombic, monoclinic, or triclinic. Moreover, the high-kappa materials of the bonding layer 104 may have any suitable crystallinity, including, for example, monocrystal, polycrystal, or amorphous.

The use of the high-kappa dielectric materials for the bonding layer 104 facilitates improved thermal performance of the semiconductor device 100, for example, by preventing or reducing performance degradation of the semiconductor devices (e.g., within the semiconductor device layer 110) due to heat. The high-kappa dielectric materials in the bonding layer 104 may improve heat dissipation, which may protect the semiconductor device layer 110 from heat degradation and which may therefore improve performance and reliability of the chip or semiconductor device 100.

In some embodiments, a first dielectric layer 112 may be disposed between the bonding layer 104 and the substrate 102. The first dielectric layer 112 may be formed of any suitable dielectric material, and in some embodiments may include one or more of $SiO_2$, SiN, SiON, SiCN, SiOCN. In some embodiments, the first dielectric layer 112 may be a silicon dioxide layer. However, embodiments provided herein are not limited thereto, and any other suitable material for the first dielectric layer 112 may be utilized in various embodiments.

Because the high-kappa bonding layer 104 is provided on the frontside of the device 100 for heat dissipation, in some embodiments, there is no need to have external electrical contacts on the frontside of the device 100 to transmit signals. As such, the frontside of the device 100 may be free of electrical contacts, such as solder bumps, C4 connectors, or the like.

Figure 1B:
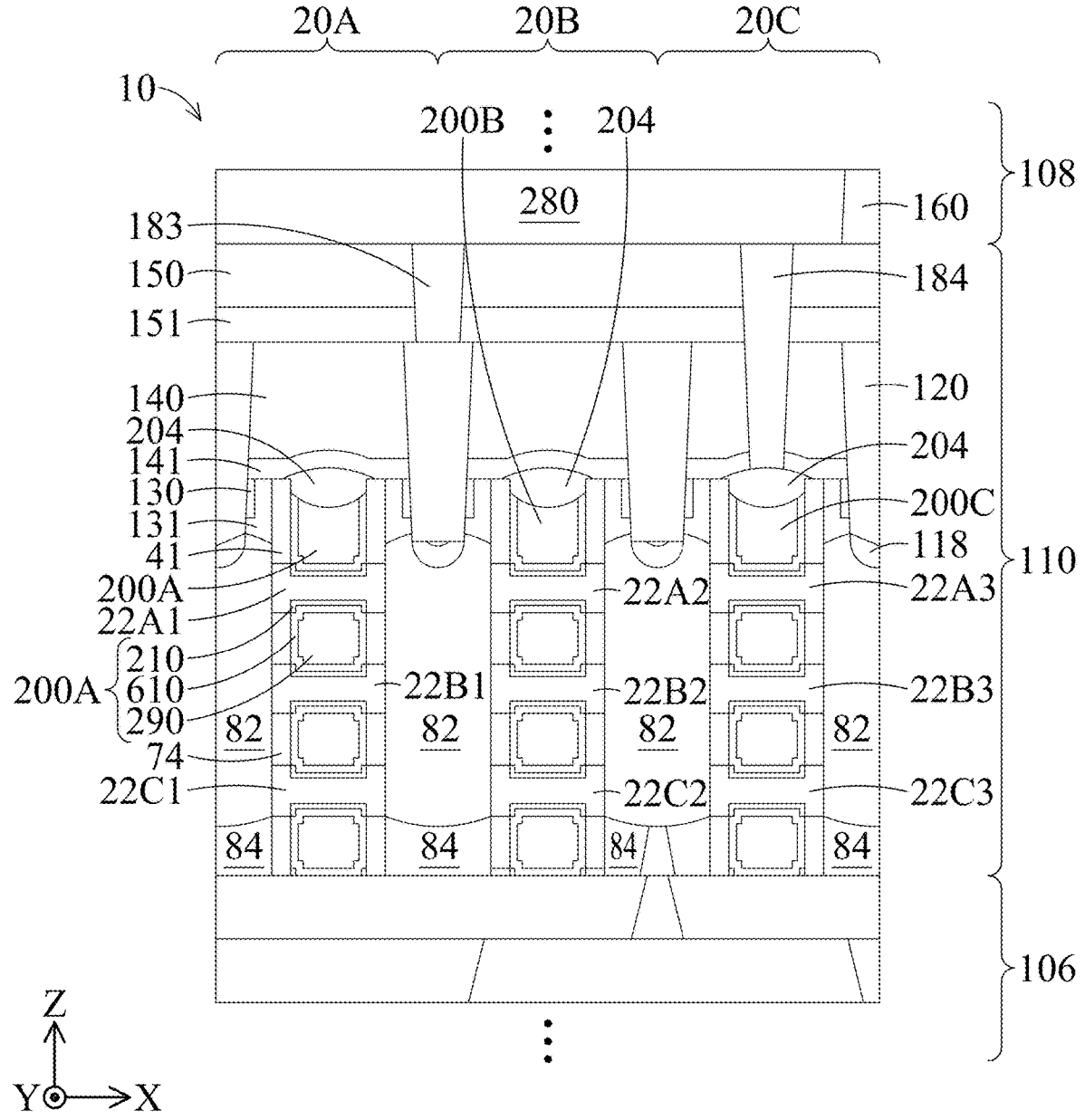
FIG. 1B is a cross-sectional diagram illustrating a region of the semiconductor device of FIG. 1A, in accordance with various embodiments.

FIG. 1B is a detailed cross-sectional view of a region 10 of the chip or semiconductor device 100 of FIG. 1A, in accordance with various embodiments.

The region 10 of the chip or semiconductor device 100 includes nanostructure devices 20A, 20B, 20C. The nanostructure devices 20A-20C may include at least an N-type FET (NFET), a P-type FET (PFET), or both, in some embodiments.

Referring to FIG. 1B, the nanostructure devices 20A-20C may be formed over and/or in a substrate, which may be removed fully or partially, where FIG. 1B illustrates a structure in which the substrate is fully removed, and is therefore not illustrated. The nanostructure devices 20A-20C generally include gate structures 200A, 200B, 200C straddling and/or wrapping around semiconductor channels 22A1-22C3, alternately referred to as "nanostructures," which may be separated by, isolation structures (e.g., shallow trench isolations, or "STIs," not illustrated in the view shown in FIG. 1B. The channels are labeled "22AX" to "22CX," where "X" is an integer from 1 to 3, corresponding to the three nanostructure devices 20A-20C, respectively. The channels 22A1-22C3 are abutted by respective source/drain regions 82. Each gate structure 200A-200C controls current flow between source/drain regions 82 through the channels 22A1-22C3. The channels 22A1-22C3 are optionally over a fin, not shown in FIG. 1B. In some embodiments, the fin is not present, for example, when the fin is removed in a process that forms the backside interconnect structure 106. Source/drain region(s) may refer to a source or a drain, individually or collectively dependent upon the context.

The channels 22A1-22C3 include a semiconductive material, for example silicon or a silicon compound, such as silicon germanium, or the like. In some embodiments, the fin structure includes silicon. The channels 22A1-22C3 are nanostructures (e.g., having sizes that are in a range of a few nanometers) and may also each have an elongated shape and extend in the X-direction. In some embodiments, the channels 22A1-22C3 each have a nano-wire (NW) shape, a nano-sheet (NS) shape, a nano-tube (NT) shape, or other suitable nanoscale shape. The cross-sectional profile of the channels 22A1-22C3 may be rectangular, round, square, circular, elliptical, hexagonal, or combinations thereof.

In some embodiments, the lengths (e.g., measured in the X-direction) of the channels 22A1-22C3 may be different from each other, for example due to tapering during a fin etching process. In some embodiments, length of the channel 22A1 may be less than a length of the channel 22B1, which may be less than length of the channel 22C1. The channels 22A1-22C3 each may not have uniform thickness, for example due to a channel trimming process used to expand spacing (e.g., measured in the Z-direction) between the channels 22A1-22C3 to increase gate structure fabrication process window. For example, a middle portion of each of the channels 22A1-22C3 may be thinner than the two ends of each of the channels 22A1-22C3. Such shape may be collectively referred to as a "dog-bone" shape, and is shown in FIG. 1B.

In some embodiments, the spacing between the channels 22A1-22C3 (e.g., between the channel 22B2 and the channel 22A2 or the channel 22C2) is in a range between about 8 nanometers (nm) and about 12 nm. In some embodiments, a thickness (e.g., measured in the Z-direction) of each of the channels 22A1-22C3 is in a range between about 5 nm and about 8 nm. In some embodiments, a width (e.g., measured in the Y-direction, orthogonal to the X-Z plane) of each of the channels 22A1-22C3 is at least about 8 nm.

The gate structures 200A-200C are disposed over and between the channels 22A1-22C3, respectively. In some embodiments, the gate structures 200A-200C are disposed over and between the channels 22A1-22C3, which are silicon channels for N-type devices or silicon germanium channels for P-type devices. In some embodiments, the gate structures 200A-200C include an interfacial layer (IL) 210, one or more gate dielectric layers 610, one or more work function tuning layers (not shown), and a metal core layer, which are shown and described in greater detail with reference to FIG. 1B.

The source/drain regions 82 may include SiB, SiGe, SiGeB, and may include dopants, such as Ge, Sb, B, or the like. In some embodiments, the source/drain regions 82 include silicon phosphorous (SiP). In some embodiments, the source/drain regions 82 have width (e.g., in the Y-axis) direction in a range of about 0.5 nm to about 100 nm. In some embodiments, height of the source/drain regions 82 (e.g., in the Z-axis direction) is in a range of about 0.1 nm to about 100 nm. The height of the source/drain regions 82 may be measured from the bottommost surface of the lowest channel 22C1, 22C2, 22 C3 to a top of the source/drain region 82.

The nanostructure devices 20A-20C may include gate spacers 41 and inner spacers 74 that are disposed on sidewalls of the gate dielectric layer 610 and the IL 210. The inner spacers 74 are also disposed between the channels 22A1-22C3. The gate spacers 41 and the inner spacers 74 may include a dielectric material, for example a low-k material such as SiOCN, SiON, SiN, SiCN or SiOC. In some embodiments, one or more additional spacer layers are present abutting the gate spacers 41. In some embodiments, thickness of the inner spacers 74 (e.g., in the X-axis direction) is in a range of about 3 nm to about 10 nm. In some embodiments, thickness of the gate spacers 41 (e.g., in the X-axis direction) is in a range of about 3 nm to about 10 nm. The nanostructure devices 20A-20C may include bottom isolation structures 84 that are beneath the source/drain regions 82. In some embodiments, the bottom isolation structures 84 include a material such as SiOCN, SiON, SiN, SiCN or SiOC, and have thickness (e.g., in the Z-axis direction) of about 3 nm to about 10 nm. The bottom isolation structures 84 are optional, and are not present in some embodiments.

The nanostructure devices 20A-20C may include source/drain contacts 120 over one or more of the source/drain regions 82. The source/drain contacts 120 may include a first liner layer, a second liner layer and a core layer, not specifically illustrated in FIG. 1B. The first liner layer may be a dielectric layer, such as SiN, SiCN, SiOCN, SiOC, or the like. In some embodiments, thickness of the first liner layer is in a range of about 3 nm to about 10 nm. The core layer may include a conductive material such as tungsten, ruthenium, cobalt, copper, molybdenum, or the like. The second liner layer is between the first liner layer and the core layer. In some embodiments, the source/drain contacts 120 have aspect ratio (e.g., height/width) in a range of about 1 to about 8. When the aspect ratio is over about 8, voids occurring when forming the source/drain contacts 120 may not be completely removed, and may be present in the source/drain contacts 120.

A silicide layer 118 may also be formed between the source/drain regions 82 and the source/drain contacts 120, so as to reduce the source/drain contact resistance. In some embodiments, the silicide layer 118 is or includes one or more of nickel, cobalt, titanium, tantalum, platinum, tungsten, other noble metals, other refractory metals, rare earth metals or their alloys. For example, the silicide layer 118 may be TiSi, TiNiSi, NiSi, WSi, CoSi, MoSi, RuSi, or the like. In some embodiments, thickness of the silicide layer 118 (in the Z direction) is in a range of about 0.5 nm to about 10 nm, such as in a range of about 3 nm to about 10 nm. In some embodiments, height of the source/drain contacts 120 may be in a range of about 1 nm to about 100 nm, such as about 10 nm to about 100 nm.

The nanostructure devices 20A-20C include an interlayer dielectric (ILD) 130 and an etch stop layer 131. The ILD 130 provides electrical isolation between the various components of the nanostructure devices 20A-20C discussed above, for example between the gate structures 200A-200C and the source/drain contacts 120 therebetween. The etch stop layer 131 may be formed prior to forming the ILD 130, and may be positioned laterally between the ILD 130 and the gate spacers 41 and vertically between the ILD 130 and the source/drain regions 82. In some embodiments, the etch stop layer 131 is or includes SiN, SiCN, SiC, SiOC, SiOCN, HfO$_2$, ZrO$_2$, ZrAlO$_x$, HfAlO$_x$, HfSiO$_x$, Al$_2$O$_3$, or other suitable material. In some embodiments, thickness of the etch stop layer 131 is in a range of about 1 nm to about 5 nm.

Overlying each of the gate structures 200A-200C are an optional gate capping conductive layer 204, a second ESL 141, the second ILD 140, a third ESL 151 and a third ILD 150. The gate capping conductive layer 204 may reduce contact resistance between a gate via 184 and the core layer of the gate structures 200A-200C (e.g., the gate structure 200C in FIG. 1). In some embodiments, the gate capping conductive layer 204 comprises a metal, such as tungsten, molybdenum, cobalt, ruthenium, or the like. The gate capping conductive layer 204 may include the same material as the core layer of the source/drain contacts 120. The gate capping conductive layer 204 may include the same material as the gate via 184. In some embodiments, thickness of a thickest part of the gate capping conductive layer 204 may be in a range of about 1 nm to about 10 nm. In some embodiments, the gate capping conductive layer 204 is a part of the gate structures 200A-200C.

The second and third ESLs 141, 151 may be similar in many respects to the ESL 131. In some embodiments, the third ESL 151 is thicker than the ESL 131, the second ESL 141, or both.

The second and third ILDs 140, 150 may be similar in many respects to the ILD 130. In some embodiments, the second ILD 140 is thicker than the ILD 130, the third ILD 150, or both.

A conductive feature 280, which may be a metal wire or trace, is electrically connected to one or more of the gate structures 200A-200C by a respective gate via 184, and is electrically connected to one or more of the source/drain contacts 120 by a respective source/drain via 183. The conductive feature 280 may be embedded in a dielectric layer 160. The conductive feature 280 may be or include a material the same as or different from that of the source/drain contacts 120 (e.g., the core layer), the source/drain via 183, the gate via 184, the gate capping conductive layer 204, or any combination thereof. Thickness of the conductive feature 280 may be in a range of about 5 nm to about 50 nm. The dielectric layer 160 may be or include SiCN, SiO, SiCON, SiN, SiC or other low-k dielectric material (e.g., k<3.9). Height of the source/drain via 183 may be in a range of about 3 nm to about 30 nm. Height of the gate via 184 may be in a range of about 10 nm to about 70 nm. In some embodiments, the conductive feature 280 is a first metallization layer of the frontside interconnect structure 108, and additional metallization layers are stacked vertically over the first metallization layer to provide electrical interconnection between one or more of the nanostructure devices 20A-20C and other nanostructure devices of the chip or semiconductor device 100.

As shown in FIG. 1B, one or more source/drain vias 183 and one or more gate vias 184 may land on source/drain contacts 120 and gate structures 200A-200C, respectively. In the example shown in FIG. 1B, the source/drain via 183 lands on the source/drain contact 120 between the nanostructure devices 20A, 20B. A gate via 184 lands on the gate structure 200C (e.g., lands on the gate capping conductive layer 204 on the gate structure 200C). The source/drain via 183 may be or include the same material as the source/drain contacts 120. For example, the source/drain vias 183 and the source/drain contacts 120 may be or include the same of one or more of W, Ru, Co, Cu, Ti, TiN, Ta, TaN, Mo, Ni, alloys thereof or the like. In the case of an alloy, the source/drain vias 183 and the source/drain contacts 120 may be or include alloys having both substantially the same elemental components and substantially the same ratio of the elemental components. By using substantially the same material for the source/drain contacts 120 and the source/drain vias 183, contact resistance is reduced between the source/drain contacts 120 and the source/drain vias 183, which enhances circuit performance of devices (e.g., the chip or semiconductor device 100) using the described configuration. In some embodiments, width of upper surfaces of the source/ drain vias 183 (e.g., in the X-direction) is in a range of about 5 nm to about 40 nm. Sidewalls of the source/drain vias 183 may be substantially vertical (e.g., perpendicular with the major surface of the semiconductor device layer 110) or may be tapered, as shown in FIG. 1B.

The gate via 184 may include two or more of a glue layer, a metal liner layer and a metal core layer. The gate via 184 extends from an upper surface of the third ILD 150, through the third ILD 150, through the third etch stop layer 151 under the third ILD 150, through the second ILD and ESL 140, 141, to an upper surface of the gate capping conductive layer 204. Sidewalls of the gate via 184 are in contact with one or more of the second and third ESLs 141, 151 and the second and third ILDs 140, 150. The lower surface of the gate via 184 is in contact with the gate capping conductive layer 204.

In some embodiments, the glue layer is or includes one or more of TiN, TaN, Ru, or other suitable material. The glue layer may land on (e.g., be in direct physical contact with) the gate capping conductive layer 204 on the gate structure 200C. In some embodiments, thickness of the glue layer may be in a range of about 5 Angstroms to about 50 Angstroms. In some embodiments, the glue layer is not present.

In some embodiments, the metal liner layer is or includes one or more of W, Ru, Al, Mo, Ti, TiN, Cu, Co or other suitable material. In some embodiments, thickness of the metal liner layer may be in a range of about 2 nm to about 20 nm. In some embodiments, the metal liner layer is in direct contact with the gate capping conductive layer 204. In some embodiments in which the glue layer is present, the metal liner layer is in contact with the gate capping conductive layer 204 through an opening in the glue layer.

In some embodiments, the metal core layer has different composition than the metal liner layer, and is or includes one or more of W, Ru, Al, Mo, Ti, TiN, Cu, Co or other suitable material. In some embodiments, width of upper surfaces of the metal core layer (e.g., in the X-direction) is in a range of about 5 nm to about 40 nm. The metal core layer may be adjacent laterally and underneath to the metal liner layer. In some embodiments in which the glue layer, the metal liner layer, or both are present, the metal liner layer is in contact with the gate capping conductive layer 204 through an opening in the glue layer, an opening in the metal liner layer, or both.

In some embodiments, the semiconductor device layer 110 includes layers and features of the structure between the backside interconnect structure 106 and the frontside interconnect structure 108, as shown by the bracket in FIG. 1B. For example, the layers and features may include the channels 22A1-22C3, the gate structures 200A-200C, the source/drain regions 82, the various spacers 41, 74, 84, the source/drain contacts 120, the source vias 183, the gate vias 184, and the various dielectric layers 130, 131, 140, 141, 150, 151, among other layers and features described in the preceding paragraphs.

FIGS. 2A through 2D illustrate a method of fabricating the device 100, in accordance with some embodiments.

Figure 2A:
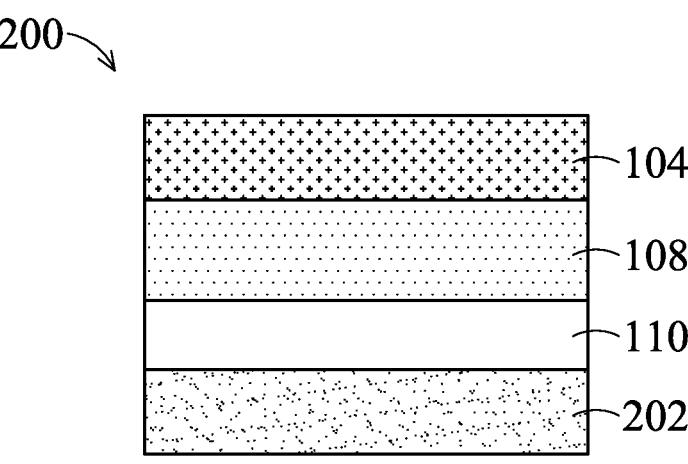
FIGS. 2A through 2D are cross-sectional diagrams illustrating a method of fabricating the semiconductor device shown of FIG. 1, in accordance with some embodiments.

As shown in FIG. 2A, the method includes forming the bonding layer 104 on a semiconductor device structure, which may be referred to as a device wafer 200. The device wafer 200 includes the semiconductor device layer 110 and the frontside interconnect structure 108, which may be the same or substantially the same as previously described herein.

The device wafer 200 further includes a substrate 202. The substrate 202 may be any suitable substrate. In some embodiments, the substrate 202 is a semiconductor substrate, such as a silicon substrate. The substrate 202 may be a semiconductor substrate, such as a bulk semiconductor, or the like, which may be doped (e.g., with a p-type or an n-type dopant) or undoped. The semiconductor material of the substrate 202 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used. The semiconductor device layer 110 may be formed on and/or in the substrate 202.

The frontside interconnect structure 108 is formed on the semiconductor device layer 110, and may be the structure shown in FIG. 1B and described with reference thereto.

The bonding layer 104 may be formed by any suitable technique. For example, in some embodiments, the bonding layer 104 is formed by deposition of a high-kappa dielectric material. In some embodiments, the bonding layer 104 is a high-kappa dielectric layer that is deposited by physical vapor deposition (PVD), chemical vapor deposition (CVD), atomic layer deposition (ALD), plasma enhanced CVD (PECVD), or any suitable deposition technique.

In some embodiments, the bonding layer 104 has a thickness that is less than 3000 nm. In some embodiments, the bonding layer 104 has a thickness that is within a range from 10 nm to 3000 nm, which may facilitate suitable bonding between adjacent structures (e.g., bonding to the frontside interconnect structure 108 and the first dielectric layer 112).

Figure 2B:
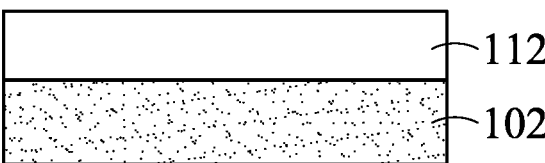

As shown in FIG. 2B, the method includes forming a first dielectric layer 112 on the substrate 102, which may be a carrier wafer or carrier substrate. The first dielectric layer 112 may be formed of any suitable dielectric material, and in some embodiments may include one or more of $SiO_2$, SiN, SiON, SiCN, or SiOCN. In some embodiments, the first dielectric layer 112 may be a silicon dioxide layer. The first dielectric layer 112 may be formed by any suitable technique, including, for example, by PVD, CVD, ALD, or any other suitable deposition technique.

In some embodiments, the first dielectric layer 112 has a thickness that is less than 3000 nm. In some embodiments, the first dielectric layer 112 has a thickness that is within a range from 10 nm to 3000 nm. In some embodiments, the first dielectric layer 112 is an organic material, which may be advantageous in providing improved heat dissipation. In some embodiments, the first dielectric layer 112 is an inorganic material, which may be advantageous for processing at higher temperatures (e.g., greater than about 400 degrees Celsius) in subsequent processes.

Figure 2C:
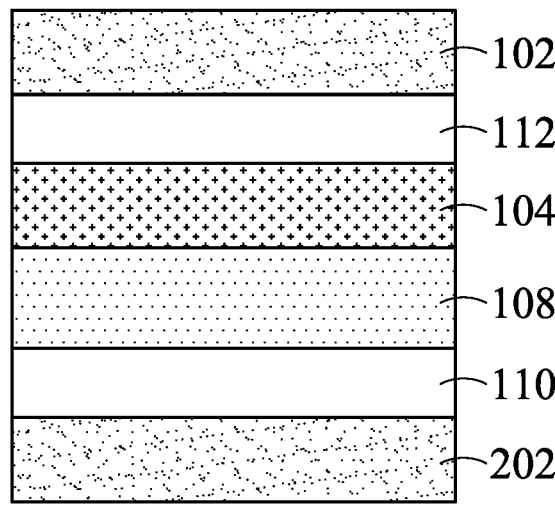

As shown in FIG. 2C, the device wafer 200 is bonded to the carrier substrate 102, for example, to protect the frontside interconnect structure 108 during backside processing of the device wafer 200. The device wafer 200 and carrier substrate 102 may be bonded to one another by any suitable technique. For example, the first dielectric layer 112 on the carrier substrate 102 may be bonded to the bonding layer 104 formed on the device wafer 200. In some embodiments, the carrier substrate 102 is bonded to the device wafer 200 (e.g., by bonding the first dielectric layer 112 and the bonding layer 104) by an ambient bonding process, for example, with ambient temperature or pressure process parameters in a bonding tool. In some embodiments, the carrier substrate 102 is bonded to the device wafer 200 by a vacuum bonding process, for example, in a bonding tool with vacuum pressure. However, embodiments are not limited thereto, and in various embodiments, bonding of the carrier substrate 102 to the device wafer 200 may be performed by any suitable bonding process.

Figure 2D:
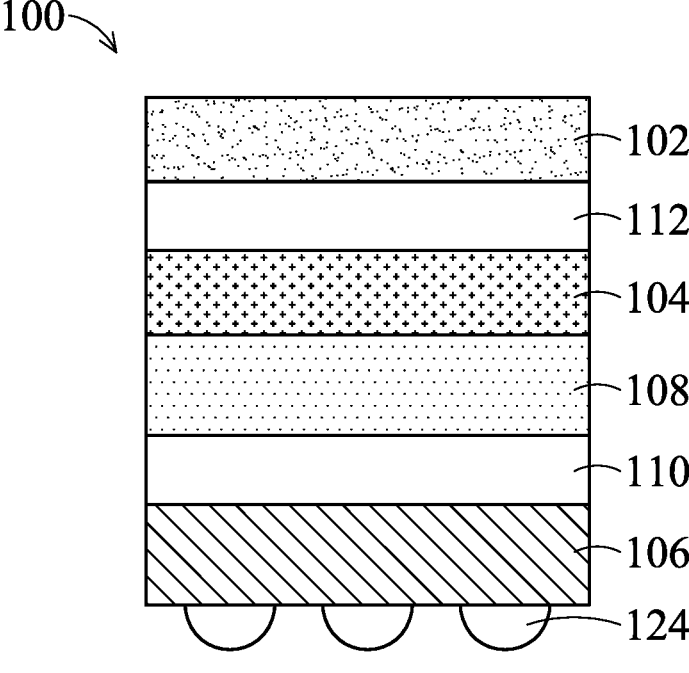

As shown in FIG. 2D, the semiconductor device 100 is formed by forming the backside interconnection structure 106 at the backside of the device 100. The backside interconnection structure 106 may be the same as or similar to that described with reference to FIG. 1B. In some embodiments, formation of the backside interconnection structure 106 includes forming a plurality of conductive features operable to deliver or receive electrical signals to or from semiconductor devices in the semiconductor device layer 110. For example, the backside interconnection structure 106 may include one or more backside power rails, metallization layers, conductive vias, and the like.

In some embodiments, formation of the backside interconnection structure 106 includes forming an insulation layer on or around the conductive features of the backside interconnection structure 106.

In some embodiments, one or more portions of the substrate 202 may be at least partially removed, for example, as part of the formation of the backside interconnection structure 106. In some embodiments, the backside interconnection structure 106 is formed in or at least partially includes portions of the substrate 202. For example, in some embodiments, the conductive features of the backside interconnection structure 106 (e.g., backside power rails, metallization layers, conductive vias, or the like) may be formed within the substrate 202.

The conductive features of the backside interconnection structure 106 may be formed to extend through the substrate 202 or insulation layer and may contact conductive or semiconductor regions (e.g., gate contact of a transistor, source/drain regions of a transistor, etc.) of the semiconductor devices in the semiconductor device layer 110.

Further, as shown in FIG. 2D, the device 100 is completed by forming the electrical contacts 124. The electrical contacts 124 may be formed by any suitable technique, including by deposition, soldering, placement of solder balls, or the like. The electrical contacts 124 may be formed on or in contact with a metallization layer of the backside interconnection structure 106. In some embodiments, the electrical contacts 124 may include power contacts, input/output contacts or any other contacts for receiving or providing electrical signals. In various embodiments, any number of electrical contacts may be included in the device 100 and may be coupled to various different conductive features or metallization pathways, e.g., to electrically couple to the semiconductor devices in the semiconductor device layer 110.

In some embodiments, following formation of the electrical contacts 124, the substrate 102 is partially or fully removed, for example, by grinding, etching, polishing, or another suitable process.

Figure 3:
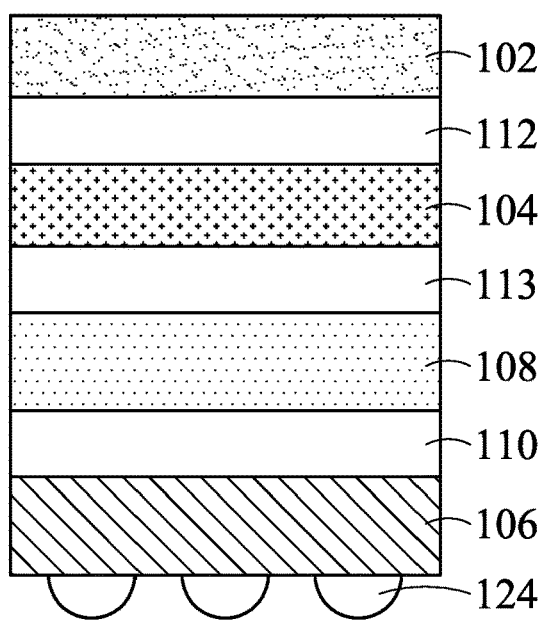
FIG. 3 is a cross-sectional diagram illustrating a semiconductor device, in accordance with some embodiments of the present disclosure.

FIG. 3 is a cross-sectional diagram illustrating a semiconductor device 300, in accordance with some embodiments of the present disclosure. The device 300 illustrated in FIG. 3 is substantially the same as the device 100 illustrated in FIG. 1A; however, the device 300 further includes a second dielectric layer 113.

More particularly, the device 300 includes an optional substrate 102, a first dielectric layer 112, a bonding layer 104, a second dielectric layer 113, frontside interconnect structure 108, a semiconductor device layer 110, a backside interconnection structure 106, and electrical contacts 124.

The substrate 102, dielectric layer 112, bonding layer 104, frontside interconnect structure 108, semiconductor device layer 110, backside interconnection structure 106 and electrical contacts 124 of the device 300 may be the same or substantially the same as previously described herein with respect to the device 100 of FIG. 1A.

For example, in some embodiments, the bonding layer 104 is a high-kappa layer formed of a high-kappa dielectric material or other suitable high-kappa material. The high-kappa dielectric material may be advantageous in preventing electrical shorts between metal lines of the frontside interconnect structure 108. In some embodiments, the bonding layer 104 is a high-kappa dielectric layer having a thermal conductivity that is greater than a thermal conductivity of silicon dioxide. In some embodiments, the bonding layer 104 is a high-kappa dielectric layer having a thermal conductivity that is greater than 10 W/m·K. In some embodiments, the bonding layer 104 is a high-kappa dielectric layer including one or more of a nitride, a metal oxide, or a carbide. In some embodiments, the bonding layer 104 includes one or more of AlN, BN, $Y_2O_3$, YAG, $Al_2O_3$, BeO, SiC, graphene, or any other suitable high-kappa material.

The bonding layer 104 is disposed between the first dielectric layer 112 and the second dielectric layer 113, and may be in direct contact with the first and second dielectric layers 112, 113 in some embodiments. The second dielectric layer 113 may be formed of any suitable dielectric material, and in some embodiments may include one or more of $SiO_2$, SiN, SiON, SiCN, SiOCN. In some embodiments, the second dielectric layer 113 may be formed of a same material as the first dielectric layer 112. In some embodiments, the second dielectric layer 113 may be a silicon dioxide layer. However, embodiments provided herein are not limited thereto, and any other suitable material for the second dielectric layer 113 may be utilized in various embodiments.

The inclusion of the second dielectric layer 113 in the device 300 of FIG. 3 may facilitate improved bonding by the bonding layer 104. For example, in some embodiments, the bonding layer 104 may be formed of a high-kappa dielectric material which bonds more readily with the material of the first and second dielectric layers 112, 113, or which exhibits an improved or advantageous bonding with the first and second dielectric layers 112, 113 (e.g., a stronger bond, faster bonding, etc.). In some embodiments, when the second dielectric layer 113 is included in the device 300, the bonding layer 104 may be or include a metal layer which includes high thermal conductivity.

Moreover, the use of the high-kappa dielectric materials for the bonding layer 104 facilitates improved thermal performance of the semiconductor device 300, for example, by preventing or reducing performance degradation of the semiconductor devices (e.g., within the semiconductor device layer 110) due to heat. The high-kappa dielectric materials in the bonding layer 104 may improve heat dissipation, which may protect the semiconductor device layer 110 from heat degradation and which may therefore improve performance and reliability of the chip or semiconductor device 300.

FIGS. 4A through 4D illustrate a method of fabricating the device 300, in accordance with some embodiments.

Figure 4A:
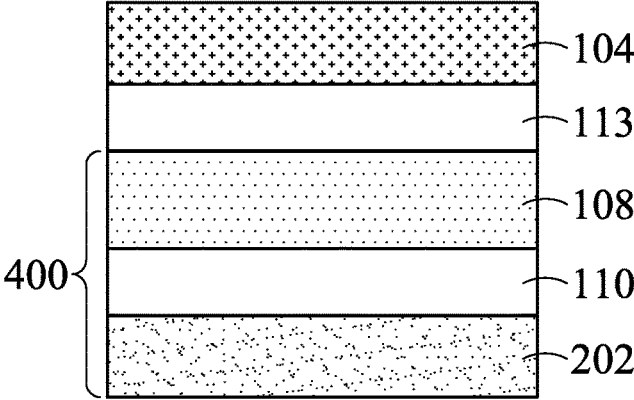
FIGS. 4A through 4D illustrate a method of fabricating the semiconductor device of FIG. 3, in accordance with some embodiments.

As shown in FIG. 4A, the method includes forming the second dielectric layer 113 on a semiconductor device structure, which may be referred to as a device wafer 400. The device wafer 400 includes the substrate 202, the semiconductor device layer 110 and the frontside interconnect structure 108, which may be the same or substantially the same as previously described herein.

The second dielectric layer 113 may be formed of any suitable dielectric material, and in some embodiments may include one or more of $SiO_2$, SiN, SiON, SiCN, or SiOCN. In some embodiments, the second dielectric layer 113 may be a silicon dioxide layer. The second dielectric layer 113 may be formed by any suitable technique, including, for example, by PVD, CVD, ALD, or any other suitable deposition technique.

In some embodiments, the second dielectric layer 113 has a thickness that is less than 3000 nm. In some embodiments, the second dielectric layer 113 has a thickness that is within a range from 10 nm to 3000 nm.

The method further includes forming the bonding layer 104 on the second dielectric layer 113. The bonding layer 104 may be formed by any suitable technique. For example, in some embodiments, the bonding layer 104 is formed by deposition of a high-kappa dielectric material. In some embodiments, the bonding layer 104 is a high-kappa dielectric layer that is deposited by physical vapor deposition (PVD), chemical vapor deposition (CVD), atomic layer deposition (ALD), plasma enhanced CVD (PECVD), or any suitable deposition technique.

In some embodiments, the bonding layer 104 has a thickness that is less than 3000 nm. In some embodiments, the bonding layer 104 has a thickness that is within a range from 10 nm to 3000 nm, which may facilitate suitable bonding between adjacent structures (e.g., bonding to the first dielectric layer 112).

Figure 4B:

As shown in FIG. 4B, the method includes forming the first dielectric layer 112 on the substrate 102, which may be a carrier wafer or carrier substrate. The first dielectric layer 112 may be formed of any suitable dielectric material, and in some embodiments may include one or more of $SiO_2$, SiN, SiON, SiCN, or SiOCN. In some embodiments, the first dielectric layer 112 may be a silicon dioxide layer. The first dielectric layer 112 may be formed by any suitable technique, including, for example, by PVD, CVD, ALD, or any other suitable deposition technique.

In some embodiments, the first dielectric layer 112 has a thickness that is less than 3000 nm. In some embodiments, the first dielectric layer 112 has a thickness that is within a range from 10 nm to 3000 nm.

Figure 4C:
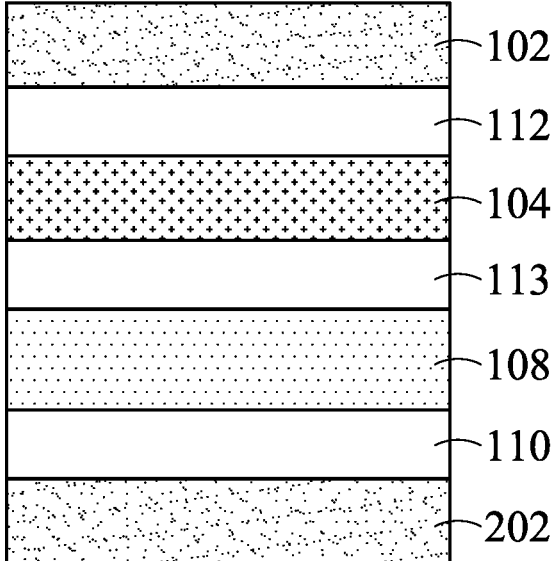

As shown in FIG. 4C, the device wafer 400 is bonded to the carrier substrate 102. The device wafer 400 and carrier substrate 102 may be bonded to one another by any suitable technique. For example, the first dielectric layer 112 on the carrier substrate 102 may be bonded to the bonding layer 104 formed on the device wafer 400. In some embodiments, the carrier substrate 102 is bonded to the device wafer 400 (e.g., by bonding the bonding layer 104 to the first dielectric layer 112) by an ambient bonding process, for example, with ambient temperature or pressure process parameters in a bonding tool. In some embodiments, the carrier substrate 102 is bonded to the device wafer 400 by a vacuum bonding process, for example, in a bonding tool with vacuum pressure. However, embodiments are not limited thereto, and in various embodiments, bonding of the carrier substrate 102 to the device wafer 400 may be performed by any suitable bonding process.

Figure 4D:
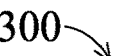
Figure 4D:
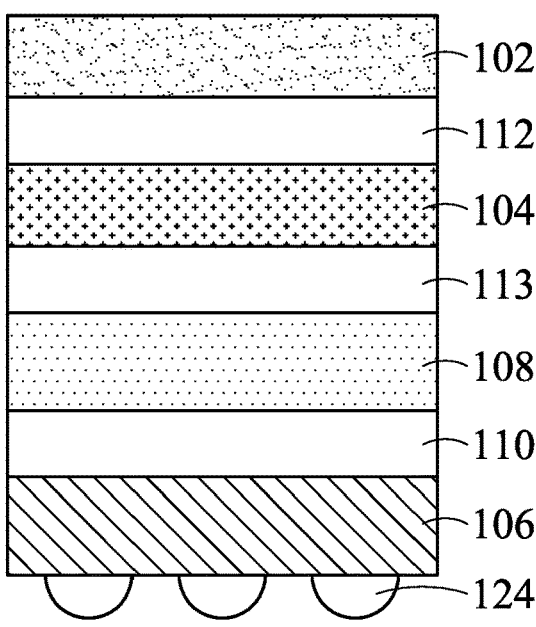

As shown in FIG. 4D, the semiconductor device 300 is formed by forming the backside interconnection structure 106 at the backside of the device 300. In some embodiments, formation of the backside interconnection structure 106 includes forming a plurality of conductive features operable to deliver or receive electrical signals to or from semiconductor devices in the semiconductor device layer 110. For example, the backside interconnection structure 106 may include one or more backside power rails, metallization layers, conductive vias, and the like.

In some embodiments, formation of the backside interconnection structure 106 includes forming an insulation layer on or around the conductive features of the backside interconnection structure 106.

In some embodiments, one or more portions of the substrate 202 may be at least partially removed, for example, as part of the formation of the backside interconnection structure 106. In some embodiments, the backside interconnection structure 106 is formed in or at least partially includes portions of the substrate 202. For example, in some embodiments, the conductive features of the backside interconnection structure 106 (e.g., backside power rails, metallization layers, conductive vias, or the like) may be formed within the substrate 202.

The conductive features of the backside interconnection structure 106 may be formed to extend through the substrate 202 or insulation layer and may contact conductive or semiconductor regions (e.g., gate contact of a transistor, source/drain regions of a transistor, etc.) of the semiconductor devices in the semiconductor device layer 110.

In some embodiments, the backside interconnection structure 106 has a thickness that is less than 10 μm. In some embodiments, the backside interconnection structure 106 has a thickness that is less than 5 μm, and in some embodiments, is within a range from 0.1 μm to 5 μm.

Further, as shown in FIG. 4D, the device 300 is completed by forming the electrical contacts 124. The electrical contacts 124 may be formed by any suitable technique, including by deposition, soldering, placement of solder balls, or the like. The electrical contacts 124 may be formed on or in contact with a metallization layer of the backside interconnection structure 106. In some embodiments, the electrical contacts 124 may include power contacts, input/output contacts or any other contacts for receiving or providing electrical signals. In various embodiments, any number of electrical contacts may be included in the device 300 and may be coupled to various different conductive features or metallization pathways, e.g., to electrically couple to the semiconductor devices in the semiconductor device layer 110.

The use of the second dielectric layer 113 in the device 300 may facilitate improved bonding by the bonding layer 104, for example, in embodiments in which the high-kappa material of the bonding layer 104 advantageously adheres with the dielectric material of the second dielectric layer 113 and advantageously bonds with the dielectric material of the first dielectric layer 112. This may provide, for example, improved bonding (e.g., stronger or faster bonding) between the device wafer 400 and the substrate 102, while also preventing or reducing thermal degradation of the semiconductor device 300 due to the presence of the high-kappa dielectric bonding layer 104.

In some embodiments, following formation of the electrical contacts 124, the substrate 102 is partially or fully removed, for example, by grinding, etching, polishing, or another suitable process.

Figure 5:
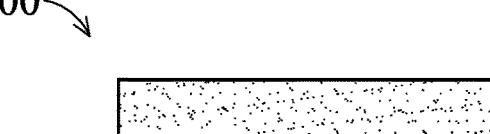
FIG. 5 is a cross-sectional diagram illustrating a semiconductor device, in accordance with some embodiments of the present disclosure.
Figure 5:
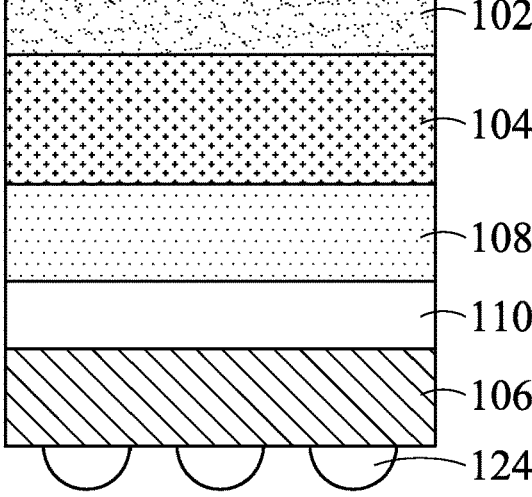

FIG. 5 is a cross-sectional diagram illustrating a semiconductor device 500, in accordance with some embodiments of the present disclosure. The device 500 illustrated in FIG. 5 is substantially the same as the device 100 illustrated in FIG. 1A; however, the device 500 does not include the dielectric layer 112.

More particularly, the device 500 includes an optional substrate 102, a bonding layer 104, frontside interconnect structure 108, a semiconductor device layer 110, a backside interconnection structure 106, and electrical contacts 124.

The substrate 102, bonding layer 104, frontside interconnect structure 108, semiconductor device layer 110, backside interconnection structure 106, and electrical contacts 124 of the device 500 may be the same or substantially the same as previously described herein with respect to the device 100 of FIG. 1A.

For example, in some embodiments, the bonding layer 104 is a high-kappa dielectric layer formed of a high-kappa dielectric material. In some embodiments, the bonding layer 104 is a high-kappa dielectric layer having a thermal conductivity that is greater than a thermal conductivity of silicon dioxide. In some embodiments, the bonding layer 104 is a high-kappa dielectric layer having a thermal conductivity that is greater than 10 W/m·K. In some embodiments, the bonding layer 104 is a high-kappa dielectric layer including one or more of a nitride, a metal oxide, or a carbide. In some embodiments, the bonding layer 104 includes one or more of AlN, BN, $Y_2O_3$, YAG, $Al_2O_3$, BeO, SiC, graphene, or any other suitable high-kappa material.

The bonding layer 104 is disposed between the substrate 102 and the frontside interconnect structure 108, and may be in direct contact with the substrate 102 and the frontside interconnect structure 108 in some embodiments.

In some embodiments, the bonding layer 104 is a multilayer structure. For example, as described in further detail later herein, the bonding layer 104 may include a first bonding layer 103 and a second bonding layer 105 which are bonded to one another, thereby providing a high-kappa dielectric material-to-high-kappa dielectric material bond.

In some embodiments, the bonding layer 104 provides suitable bonding between the substrate 102 and the frontside interconnect structure 108, e.g., without the inclusion of a dielectric layer, such as the first or second dielectric layers 112, 113 previously described herein.

The use of the high-kappa dielectric materials for the bonding layer 104 facilitates improved thermal performance of the semiconductor device 500, for example, by preventing or reducing performance degradation of the semiconductor devices (e.g., within the semiconductor device layer 110) due to heat. The high-kappa dielectric materials in the bonding layer 104 may improve heat dissipation, which may protect the semiconductor device layer 110 from heat degradation and which may therefore improve performance and reliability of the chip or semiconductor device 500.

Further, the omission of the dielectric layers in the device 500 of FIG. 5 may facilitate an overall reduction of thickness or height of the device 500. For example, in some embodiments, the bonding layer 104 may be formed of a high-kappa dielectric material which suitably bonds with the materials of the frontside interconnect structure 108 and the substrate 102, thereby facilitating omission of additional layers for bonding, such as dielectric layers.

FIGS. 6A through 6D illustrate a method of fabricating the device 500, in accordance with some embodiments.

Figure 6A:
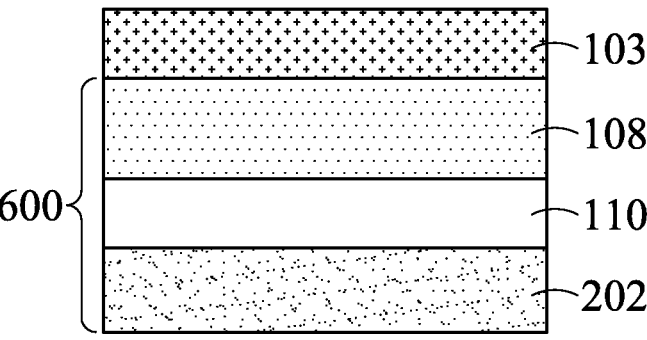
FIGS. 6A through 6D illustrate a method of fabricating the semiconductor device of FIG. 5, in accordance with some embodiments.

As shown in FIG. 6A, the method includes forming a first bonding layer 103 on a semiconductor device structure, which may be referred to as a device wafer 600. The device wafer 600 includes the substrate 202, the semiconductor device layer 110 and the frontside interconnect structure 108, which may be the same or substantially the same as previously described herein.

The first bonding layer 103 may form a first portion or first sub-layer of the bonding layer 104 of the device 500.

The first bonding layer 103 may be formed by any suitable technique. For example, in some embodiments, the first bonding layer 103 is formed by deposition of a high-kappa dielectric material. In some embodiments, the first bonding layer 103 is a high-kappa dielectric layer that is deposited by physical vapor deposition (PVD), chemical vapor deposition (CVD), atomic layer deposition (ALD), plasma enhanced CVD (PECVD), or any suitable deposition technique.

In some embodiments, the first bonding layer 103 has a thickness that is less than 3000 nm. In some embodiments, the first bonding layer 103 has a thickness that is within a range from 10 nm to 3000 nm, which may facilitate suitable bonding between adjacent structures (e.g., bonding to the frontside interconnect structure 108 and a second bonding layer 105 or the substrate 102).

Figure 6B:
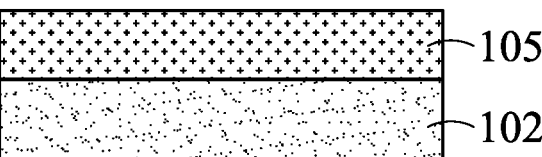

As shown in FIG. 6B, the method may include forming a second bonding layer 105 on the substrate 102, which may be a carrier wafer or carrier substrate. The second bonding layer 105 may form a second portion or second sub-layer of the bonding layer 104 of the device 500, in some embodiments. The second bonding layer 105 may be formed by any suitable technique, including, for example, by deposition of a high-kappa dielectric material. In some embodiments, the second bonding layer 105 is a high-kappa dielectric layer that is deposited by physical vapor deposition (PVD), chemical vapor deposition (CVD), atomic layer deposition (ALD), plasma enhanced CVD (PECVD), or any suitable deposition technique. In some embodiments, the second bonding layer 105 is formed of a same material as the first bonding layer 103.

In some embodiments, the second bonding layer 105 has a thickness that is less than 3000 nm. In some embodiments, the second bonding layer 105 has a thickness that is within a range from nm to 3000 nm, which may facilitate suitable bonding between adjacent structures (e.g., bonding to the first bonding layer 103 and the substrate 102).

In some embodiments, the second bonding layer 105 may be omitted. For example, the first bonding layer 103 may be the same as the bonding layer 104 of the device 500, and the first bonding layer 103 may be bonded directly to the substrate 102. In embodiments in which both the first and second bonding layers 103, 105 are included, the first and second bonding layers 103, 105 may collectively form the bonding layer 104, and may have a combined thickness that is within a range from 10 nm to 3000 nm.

Figure 6C:
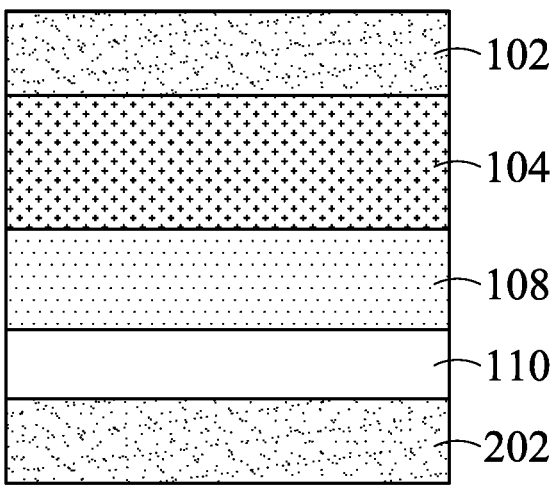

As shown in FIG. 6C, the device wafer 600 is bonded to the carrier substrate 102. The device wafer 600 and carrier substrate 102 may be bonded to one another by any suitable technique. For example, the first bonding layer 103 on the device wafer 600 may be bonded to the second bonding layer 105 on the carrier substrate 102. In some embodiments, the bonding layer 104 is formed by the first bonding layer 103 and the second bonding layer 105 is omitted. In such embodiments, the first bonding layer 103 may be formed on the device wafer 600 (e.g., on the one or more metal layers 108) and the carrier substrate 102 may be directly bonded to the first bonding layer 103.

In some embodiments, the carrier substrate 102 is bonded to the device wafer 600 by an ambient bonding process, for example, with ambient temperature or pressure process parameters in a bonding tool. In some embodiments, the carrier substrate 102 is bonded to the device wafer 600 by a vacuum bonding process, for example, in a bonding tool with vacuum pressure. However, embodiments are not limited thereto, and in various embodiments, bonding of the carrier substrate 102 to the device wafer 600 may be performed by any suitable bonding process.

Figure 6D:
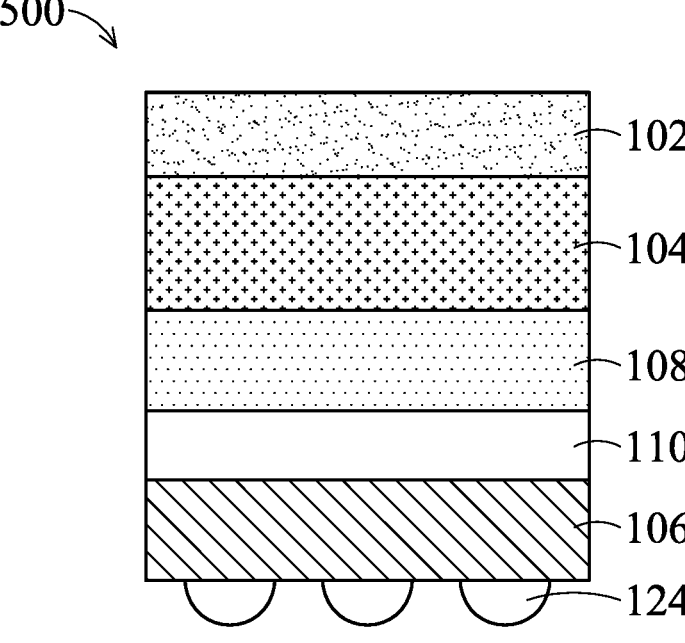

As shown in FIG. 6D, the semiconductor device 500 is formed by forming the backside interconnection structure 106 at the backside of the device 500. In some embodiments, formation of the backside interconnection structure 106 includes forming a plurality of conductive features operable to deliver or receive electrical signals to or from semiconductor devices in the semiconductor device layer 110. For example, the backside interconnection structure 106 may include one or more backside power rails, metallization layers, conductive vias, and the like.

In some embodiments, formation of the backside interconnection structure 106 includes forming an insulation layer on or around the conductive features of the backside interconnection structure 106.

In some embodiments, one or more portions of the substrate 202 may be at least partially removed, for example, as part of the formation of the backside interconnection structure 106. In some embodiments, the backside interconnection structure 106 is formed in or at least partially includes portions of the substrate 202. For example, in some embodiments, the conductive features of the backside interconnection structure 106 (e.g., backside power rails, metallization layers, conductive vias, or the like) may be formed within the substrate 202.

The conductive features of the backside interconnection structure 106 may be formed to extend through the substrate 202 or insulation layer and may contact conductive or semiconductor regions (e.g., gate contact of a transistor, source/drain regions of a transistor, etc.) of the semiconductor devices in the semiconductor device layer 110.

In some embodiments, the backside interconnection structure 106 has a thickness that is less than 10 μm. In some embodiments, the backside interconnection structure 106 has a thickness that is less than 5 μm, and in some embodiments, is within a range from 0.1 μm to 5 μm.

Further, as shown in FIG. 6D, the device 500 is completed by forming the electrical contacts 124. The electrical contacts 124 may be formed by any suitable technique, including by deposition, soldering, placement of solder balls, or the like. The electrical contacts 124 may be formed on or in contact with a metallization layer of the backside interconnection structure 106. In some embodiments, the electrical contacts 124 may include power contacts, input/output contacts or any other contacts for receiving or providing electrical signals. In various embodiments, any number of electrical contacts may be included in the device 500 and may be coupled to various different conductive features or metallization pathways, e.g., to electrically couple to the semiconductor devices in the semiconductor device layer 110.

The use of the second dielectric layer 113 in the device 300 may facilitate improved bonding by the bonding layer 104, for example, in embodiments in which the high-kappa material of the bonding layer 104 advantageously bonds with the dielectric material of the first and second dielectric layers 112, 113. This may provide, for example, improved bonding (e.g., stronger or faster bonding) between the device wafer 400 and the substrate 102, while also preventing or reducing thermal degradation of the semiconductor device 300 due to the presence of the high-kappa dielectric bonding layer 104.

As described previously herein, the use of the high-kappa dielectric materials for the bonding layer 104 facilitates improved thermal performance of the semiconductor device 500, while the omission of the dielectric layers in the device 500 may facilitate an overall reduction of thickness or height of the device 500.

In some embodiments, following formation of the electrical contacts 124, the substrate 102 is partially or fully removed, for example, by grinding, etching, polishing, or another suitable process.

Figure 7:
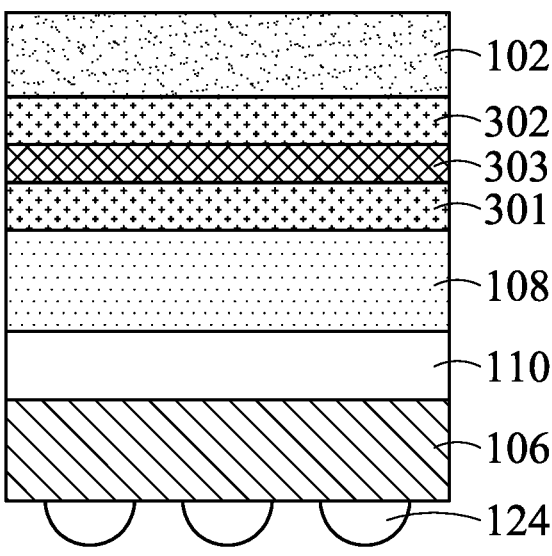
FIG. 7 is a cross-sectional diagram illustrating a semiconductor device, in accordance with some embodiments of the present disclosure.

FIG. 7 is a cross-sectional diagram illustrating a semiconductor device 700, in accordance with some embodiments of the present disclosure. The device 700 illustrated in FIG. 7 is substantially the same as the device 100 illustrated in FIG. 1A; however, the device 700 has a different bonding structure which includes a first bonding layer 301, a second bonding layer 302, and a third bonding layer 303. Moreover, the device 700 does not include the dielectric layer 112 in some embodiments.

In some embodiments, the device 700 includes a substrate 102, frontside interconnect structure 108, a semiconductor device layer 110, a backside interconnection structure 106, and electrical contacts 124. The substrate 102, frontside interconnect structure 108, semiconductor device layer 110, backside interconnection structure 106, and electrical contacts 124 of the device 700 may be the same or substantially the same as previously described herein with respect to the device 100 of FIG. 1A. In some embodiments, the substrate 102 is optional, and may be fully or partially removed, for example, by a suitable removal operation, such as a grind, an etch, a CMP, or a combination thereof. During the removal operation, the device 700 may be attached to a suitable carrier, such as a carrier wafer. The carrier may be attached to the electrical contacts 124 during the removal operation, then may be removed following completion of the removal operation. Full or partial removal of the substrate 102 may be advantageous to reducing overall thickness of the device 700. The substrate 102 may be similarly fully or partially removed in the devices 100, 300, 500.

In some embodiments, the first and second bonding layers 301, 302 may be formed of a same or substantially same material as previously described herein with respect to the bonding layer 104. For example, in some embodiments, each of the first and second bonding layers 301, 302 may be a high-kappa dielectric layer formed of a high-kappa dielectric material. In some embodiments, the first and second bonding layers 301, 302 are high-kappa dielectric layers having a thermal conductivity that is greater than a thermal conductivity of silicon dioxide. In some embodiments, the first and second bonding layers 301, 302 are high-kappa dielectric layers having a thermal conductivity that is greater than 10 W/m·K. In some embodiments, the first and second bonding layers 301, 302 are high-kappa dielectric layers including one or more of a nitride, a metal oxide, or a carbide. In some embodiments, each of the first and second bonding layers 301, 302 includes one or more of AlN, BN, $Y_2O_3$, YAG, $Al_2O_3$, BeO, SiC, graphene, or any other suitable high-kappa material. In some embodiments, the first and second bonding layers 301, 302 are formed of a same material.

In some embodiments, the third bonding layer 303 is formed of a different material than one or both of the first and second bonding layers 301, 302. In some embodiments, the third bonding layer 303 is a semiconductor layer or includes one or more semiconductor materials. In some embodiments, the third bonding layer 303 includes at least one of Si, Se, SiGe, or any other semiconductor material. In some embodiments, the third bonding layer 303 includes an organic material, which may be advantageous for improving thermal conductivity. In some embodiments, the third bonding layer may include an inorganic material, which may be advantageous for withstanding higher temperatures in subsequent processes. In some embodiments, the third bonding layer 303 is or includes a metal layer, which may be advantageous for increasing thermal conductivity. However, embodiments are not limited thereto, and in various embodiments, the third bonding layer 303 may be formed of any material which is suitable for bonding with the high-kappa dielectric material of the first and second bonding layers 301, 302.

The first bonding layer 301 is disposed between the frontside interconnect structure 108 and the third bonding layer 303, and may be in direct contact with the frontside interconnect structure 108 and the third bonding layer 303 in some embodiments.

The second bonding layer 302 is disposed between the carrier substrate 102 and the third bonding layer 303, and may be in direct contact with the carrier substrate 102 and the third bonding layer 303 in some embodiments.

In some embodiments, the third bonding layer 303 has a thickness that is less than a thickness of at least one of the first bonding layer 301 or the second bonding layer 302. In some embodiments, the third bonding layer 303 has a thickness that is less than a thickness of each of the first bonding layer 301 or the second bonding layer 302.

The inclusion of the third bonding layer 303 in the device 700 of FIG. 7 may facilitate improved bonding by the bonding structure, e.g., including the first, second, and third bonding layers 301, 302, 303. For example, in some embodiments, the first and second bonding layers 301, 302 may be formed of a high-kappa dielectric material which bonds more readily with the material of the third bonding layer 303, or which exhibits an improved or advantageous bonding with the third bonding layer 303 (e.g., a stronger bond, faster bonding, etc.). This is particularly advantageous in embodiments in which direct bonding between the high-kappa dielectric material of the first and second bonding layers 301, 302 is unsuitable or otherwise undesirable, or in which bonding between the first and second bonding layers 301, 302 is desired to be improved. For example, the first and second bonding layers 301, 302, while being the same material, may have surface properties that increase difficulty of forming a strong bond therebetween. The third bonding layer 303 may act as a glue or otherwise provide adhesive or improved bonding to the high-kappa dielectric material of the first and second bonding layers 301, 302.

Moreover, the use of the high-kappa dielectric materials for the first and second bonding layers 301, 302 facilitates improved thermal performance of the semiconductor device 700, for example, by preventing or reducing performance degradation of the semiconductor devices (e.g., within the semiconductor device layer 110) due to heat. The high-kappa dielectric materials in the first and second bonding layers 301, 302 may improve heat dissipation, which may protect the semiconductor device layer 110 from heat degradation and which may therefore improve performance and reliability of the chip or semiconductor device 700.

FIGS. 8A through 8E illustrate a method of fabricating the device 700, in accordance with some embodiments.

Figure 8A:
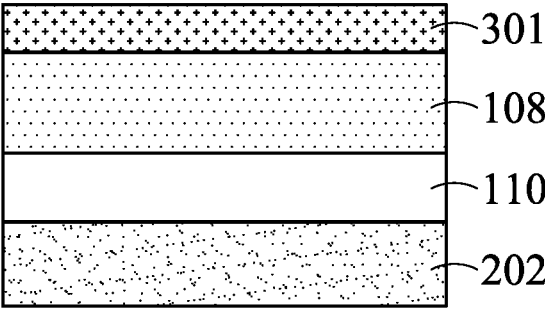
FIGS. 8A through 8E illustrate a method of fabricating the semiconductor device of FIG. 7, in accordance with some embodiments.

As shown in FIG. 8A, the method includes forming the first bonding layer 301 on a semiconductor device structure, which may be referred to as a device wafer 800. The device wafer 800 includes the substrate 202, the semiconductor device layer 110 and the frontside interconnect structure 108, which may be the same or substantially the same as previously described herein.

The first bonding layer 301 may be formed by any suitable technique. For example, in some embodiments, the first bonding layer 301 is formed by deposition of a high-kappa dielectric material. In some embodiments, the first bonding layer 301 is a high-kappa dielectric layer that is deposited by physical vapor deposition (PVD), chemical vapor deposition (CVD), atomic layer deposition (ALD), plasma enhanced CVD (PECVD), or any suitable deposition technique.

In some embodiments, the first bonding layer 301 has a thickness that is less than 3000 nm. In some embodiments, the first bonding layer 301 has a thickness that is within a range from 10 nm to 3000 nm, which may facilitate suitable bonding between adjacent structures (e.g., bonding to the frontside interconnect structure 108 and to the third bonding layer 303).

Figure 8B:
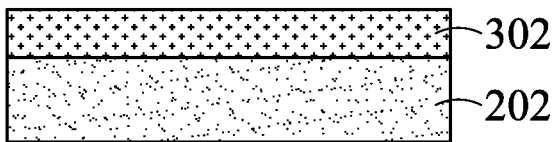

As shown in FIG. 8B, the method includes forming the second bonding layer 302 on the substrate 102, which may be a carrier wafer or carrier substrate. The second bonding layer 302 may be formed by any suitable technique. For example, in some embodiments, the second bonding layer 302 is formed by deposition of a high-kappa dielectric material. In some embodiments, the second bonding layer 302 is a high-kappa dielectric layer that is deposited by physical vapor deposition (PVD), chemical vapor deposition (CVD), atomic layer deposition (ALD), plasma enhanced CVD (PECVD), or any suitable deposition technique.

In some embodiments, the second bonding layer 302 has a thickness that is less than 3000 nm. In some embodiments, the second bonding layer 302 has a thickness that is within a range from nm to 3000 nm, which may facilitate suitable bonding between adjacent structures (e.g., bonding to the substrate 102 and to the third bonding layer 303).

In some embodiments, the first and second bonding layers 301, 302 are formed of a same material. In some embodiments, the first and second bonding layers 301, 302 may have a same or substantially same thickness.

Figure 8C:
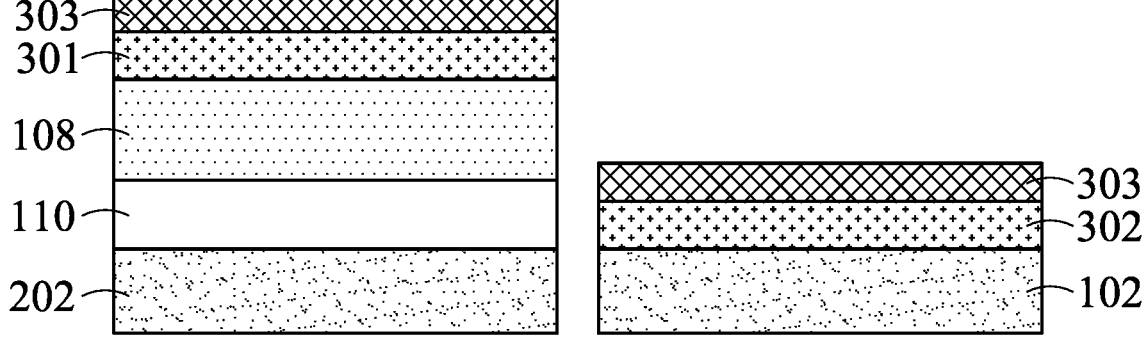

As shown in FIG. 8C, the third bonding layer 303 is formed. In various embodiments, the third bonding layer 303 may be formed on one or both of the first bonding layer 301 and the second bonding layer 302.

For example, as shown in FIG. 8C, the third bonding layer 303 may be formed directly on the first bonding layer 301 on the device wafer 800. In some embodiments, the third bonding layer 303 is formed on only the first bonding layer 301 on the device wafer 800, and the carrier wafer may be bonded for example by bonding the third bonding layer 303 on the device wafer 800 directly to the second bonding layer 302 on the carrier substrate 102.

In some embodiments, the third bonding layer 303 may be formed directly on the second bonding layer 302 on the carrier substrate 102. In some embodiments, the third bonding layer 303 is formed on only the second bonding layer 302 on the carrier substrate, and the device wafer 800 may be bonded for example by bonding the third bonding layer 303 on the carrier substrate 102 directly to the first bonding layer 301 on the device wafer 800.

In some embodiments, the third bonding layer 303 may be a multi-layer structure that includes portions that are formed on each of the carrier substrate 102 and the device wafer 800. For example, a first sub-layer of the third bonding layer 303 may be formed directly on the first bonding layer 301 on the device wafer 800, and a second sub-layer of the third bonding layer 303 may be formed directly on the second bonding layer 302 on the carrier substrate 102.

In some embodiments, the third bonding layer 303 has a thickness that is less than 50 nm. In some embodiments, the third bonding layer 303 has a thickness that is within a range from 0.5 nm to 50 nm, which may facilitate suitable bonding between adjacent structures (e.g., bonding to the first and second bonding layers 301, 302) while having a small thickness.

In some embodiments, the thickness of the third bonding layer 303 is less than a thickness of the first bonding layer 301 and less than a thickness of the second bonding layer 302. The relatively small thickness of the third bonding layer 303 improves the overall thermal conductivity of the device 700, in some embodiments, as the third bonding layer 303 may be formed of a material having a lower thermal conductivity than the first and second bonding layers 301, 302.

Figure 8D:
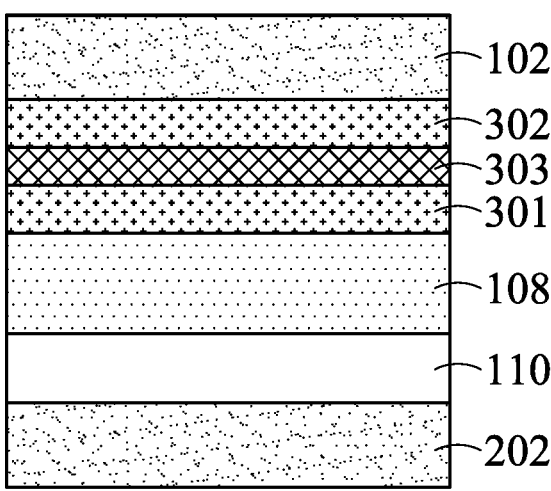

As shown in FIG. 8D, the device wafer 800 is bonded to the carrier substrate 102. The device wafer 800 and carrier substrate 102 may be bonded to one another by any suitable technique. For example, in some embodiments the first portion of the third bonding layer 303 on the device wafer 800 may be bonded to the second portion of the third bonding layer 303 on the carrier substrate 102. In some embodiments, the third bonding layer 303 is formed on only the first bonding layer 301 on the device wafer 800, and the second bonding layer 302 on the carrier substrate 102 may be bonded to the third bonding layer 303. In some embodiments, the third bonding layer 303 is formed on only the second bonding layer 302 on the carrier substrate, and the device wafer 800 may be bonded by bonding the third bonding layer 303 on the carrier substrate 102 directly to the first bonding layer 301 on the device wafer 800.

In some embodiments, the carrier substrate 102 is bonded to the device wafer 800 by an ambient bonding process, for example, with ambient temperature or pressure process parameters in a bonding tool. In some embodiments, the carrier substrate 102 is bonded to the device wafer 800 by a vacuum bonding process, for example, in a bonding tool with vacuum pressure. However, embodiments are not limited thereto, and in various embodiments, bonding of the carrier substrate 102 to the device wafer 800 may be performed by any suitable bonding process.

Figure 8E:
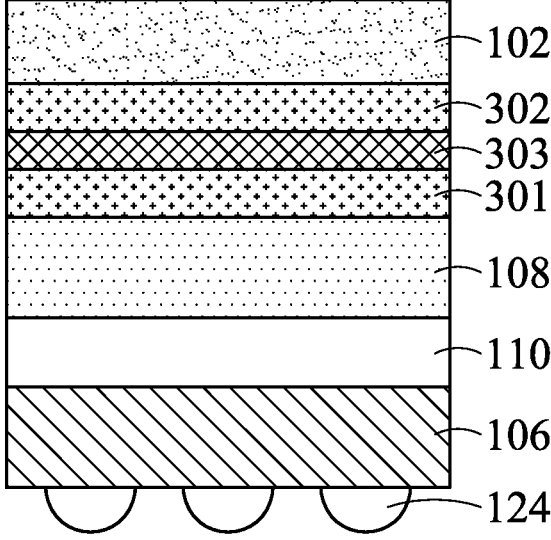

As shown in FIG. 8E, the semiconductor device 700 is formed by forming the backside interconnection structure 106 at the backside of the device 700. In some embodiments, formation of the backside interconnection structure 106 includes forming a plurality of conductive features operable to deliver or receive electrical signals to or from semiconductor devices in the semiconductor device layer 110. For example, the backside interconnection structure 106 may include one or more backside power rails, metallization layers, conductive vias, and the like.

In some embodiments, formation of the backside interconnection structure 106 includes forming an insulation layer on or around the conductive features of the backside interconnection structure 106.

In some embodiments, one or more portions of the substrate 202 may be at least partially removed, for example, as part of the formation of the backside interconnection structure 106. In some embodiments, the backside interconnection structure 106 is formed in or at least partially includes portions of the substrate 202. For example, in some embodiments, the conductive features of the backside interconnection structure 106 (e.g., backside power rails, metallization layers, conductive vias, or the like) may be formed within the substrate 202.

The conductive features of the backside interconnection structure 106 may be formed to extend through the substrate 202 or insulation layer and may contact conductive or semiconductor regions (e.g., gate contact of a transistor, source/drain regions of a transistor, etc.) of the semiconductor devices in the semiconductor device layer 110.

In some embodiments, the backside interconnection structure 106 has a thickness that is less than 10 μm. In some embodiments, the backside interconnection structure 106 has a thickness that is less than 5 μm, and in some embodiments, is within a range from 0.1 μm to 5 μm.

Further, as shown in FIG. 8E, the device 700 is completed by forming the electrical contacts 124. The electrical contacts 124 may be formed by any suitable technique, including by deposition, soldering, placement of solder balls, or the like. The electrical contacts 124 may be formed on or in contact with a metallization layer of the backside interconnection structure 106. In some embodiments, the electrical contacts 124 may include power contacts, input/output contacts or any other contacts for receiving or providing electrical signals. In various embodiments, any number of electrical contacts may be included in the device 700 and may be coupled to various different conductive features or metallization pathways, e.g., to electrically couple to the semiconductor devices in the semiconductor device layer 110.

In some embodiments, following formation of the electrical contacts 124, the substrate 102 is partially or fully removed, for example, by grinding, etching, polishing, or another suitable process.

Figure 9:
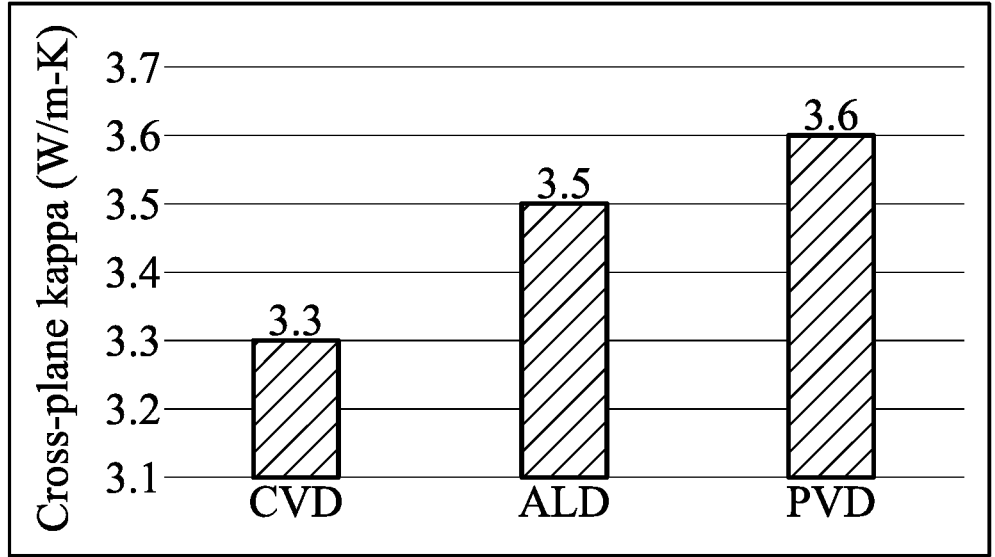
FIG. 9 is a diagram illustrating cross-plane kappa of an AlN layer in accordance with various embodiments.

In some embodiments, the bonding layers may be formed by physical vapor deposition (PVD), chemical vapor deposition (CVD), or atomic layer deposition (ALD). In some embodiments, the cross-plane kappa (KL) of the bonding layers may slightly change depending on the deposition method. "Cross-plane kappa" includes the meaning of thermal conductivity along an axis normal to a major surface of a material layer. For example, the first bonding layer 301 may have its major surface in an X-Y plane, and the cross-plane kappa thereof may be measured along the Z-axis. For example, as shown in FIG. 9, the cross-plane kappa of an AlN layer having a same or substantially same thickness (which may be the high-kappa dielectric bonding layer in some embodiments) is lowest using CVD as a deposition process, next lowest using ALD as the deposition process, and highest using PVD as the deposition process. The difference in the cross-plane kappa based on deposition method is due to the crystallinity of the deposited bonding layer. For example, PVD deposition may result in a more crystalline bonding layer, while CVD and ALD deposition may result in a more amorphous bonding layer than produced by PVD deposition. Thus, in some embodiments, the bonding layers of any of the embodiments provided herein may be formed by PVD, which may be advantageous for the reasons discussed herein.

In various embodiments provided herein, the bonding layers (e.g., the bonding layer 104, one or both of the bonding layers 301, 302) have a thermal conductivity that is greater than 10 W/m·K. In some embodiments, the bonding layers may have a thermal conductivity that is greater than 50 W/m·K, and in some embodiments, greater than 100 W/m·K. The thermal conductivity may be dependent on the thickness of the bonding layer in some embodiments. For example, in an embodiment in which the bonding layer is AlN that is formed by PVD, the cross-plane kappa of the bonding layer may gradually decrease as the thickness is increased, for example, from about 150 W/m·K at a thickness of about 100 nm to about 38 W/m·K at a thickness of about 1.2 μm.

In some embodiments, the bonding layer has a thickness that is less than 3000 nm. In some embodiments, the bonding layer has a thickness that is less than 1000 nm. In some embodiments, the bonding layer has a thickness that is within a range from 10 nm to 3000 nm, which may facilitate suitable bonding between adjacent structures while also advantageously providing increased thermal conductivity. In some embodiments, the bonding layer has a thickness that is within a range from 50 nm to 500 nm which may result in even greater improvements in thermal conductivity.

Embodiments of the present disclosure provide several advantages. For example, the use of the high-kappa dielectric materials for the bonding layer in various embodiments facilitates improved thermal performance of a semiconductor device or package, for example, by preventing or reducing performance degradation of semiconductor devices within a semiconductor device layer due to heat. The high-kappa dielectric materials in the bonding layer may improve heat dissipation, which may protect the semiconductor device layer from heat degradation and which may therefore improve performance and reliability.

According to one embodiment, a device includes a first substrate. A semiconductor device layer is disposed on and/or in the first substrate, and the semiconductor device layer includes one or more semiconductor devices. A frontside interconnect structure including frontside interconnect structure is disposed on a first side of the semiconductor device layer. A backside interconnect structure is disposed on a second side of the semiconductor device layer opposite the first side. One or more electrical contacts are disposed on the backside interconnect structure. A thermally conductive bonding layer is disposed on the frontside interconnect structure. The thermally conductive bonding layer has a thermal conductivity greater than 10 W/m-K.

In another embodiment, a method is provided that includes forming a thermally conductive bonding layer on a device wafer. The device wafer includes a first substrate, a semiconductor device layer on the first substrate, and frontside interconnect structure. The thermally conductive bonding layer has a thermal conductivity greater than 10 W/m-K. A second substrate is bonded to the thermally conductive bonding layer. The method further includes: forming a thinned first substrate by thinning the first substrate; and forming a backside interconnect structure on a side of the semiconductor device layer opposite the thermally conductive bonding layer.

In yet another embodiment, a method includes forming a first dielectric layer on a device wafer. The first dielectric layer is a high-kappa dielectric layer having a thickness less than 3000 nm and a thermal conductivity greater than 10 W/m-K. A second dielectric layer is formed on a carrier substrate, and the second dielectric layer is formed of a different material than the first dielectric layer. The first dielectric layer of the device wafer is bonded to the second dielectric layer of the carrier substrate. The method further includes: forming a thinned backside by thinning a backside of the device wafer; forming a backside interconnect structure on the thinned backside; and forming one or more electrical contacts on the backside interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first substrate;
a semiconductor device layer in the first substrate, the semiconductor device layer including one or more semiconductor devices;
a frontside interconnect structure on a first side of the semiconductor device layer;
a backside interconnect structure on a second side of the semiconductor device layer, the second side being opposite the first side;
one or more electrical contacts on the backside interconnect structure;
a first dielectric layer disposed on the frontside interconnect structure;
a bonding layer on the first dielectric layer, the bonding layer having thermal conductivity greater than 10 W/m-K; and
a second dielectric layer on the bonding layer, the bonding layer being disposed between the second dielectric layer and the first dielectric layer.

2. The device of claim 1, further comprising a second substrate disposed on a side of the second dielectric layer opposite the bonding layer.

3. The device of claim 1, wherein the first dielectric layer and the second dielectric layer are formed of different dielectric materials.

4. The device of claim 1, wherein the backside interconnect structure has a thickness less than 5 μm.

5. The device of claim 1, wherein the bonding layer includes one or more of: AlN, BN, $Y_2O_3$, YAG, $Al_2O_3$, BeO, SiC, or graphene.

6. The device of claim 1, wherein the bonding layer has a thickness within a range of 10 nm to 3000 nm.

7. The device of claim 1, further comprising:
a semiconductor bonding layer,
wherein the bonding layer includes a first bonding layer portion and a second bonding layer portion, the semiconductor bonding layer being disposed directly between the first and second bonding layer portions.

8. The device of claim 7, wherein the semiconductor bonding layer has a thickness that is less than a thickness of each of the first and second bonding layer portions.

9. The device of claim 1, wherein a frontside of the device is free of electrical contacts.

10. The device of claim 1, wherein the front-side interconnect structure has an overall thickness less than 5 μm.

11. A method, comprising:

forming a bonding layer on a device wafer, the device wafer including a first substrate, a semiconductor device layer on the first substrate, and frontside interconnect structure, the bonding layer having a thermal conductivity greater than 10 W/m-K;

bonding a second substrate to the bonding layer;

forming a thinned first substrate by thinning the first substrate;

forming a backside interconnect structure on a side of the semiconductor device layer opposite the bonding layer; and removing the second substrate while leaving the bonding layer in place.

12. The method of claim 11, further comprising:

forming a first dielectric layer between the frontside interconnect structure and the bonding layer.

13. The method of claim 12, further comprising:

forming a second dielectric layer between the bonding layer and the second substrate.

14. The method of claim 11, wherein forming the bonding layer includes forming the bonding layer directly between and in contact with the frontside interconnect structure and the second substrate.

15. The method of claim 11, wherein the bonding layer includes one or more of: AlN, BN, $Y_2O_3$, YAG, $Al_2O_3$, BeO, SiC, or graphene.

16. The method of claim 11, further comprising:

forming a semiconductor bonding layer on the bonding layer on the device wafer, wherein bonding the second substrate to the bonding layer includes bonding the second substrate to the semiconductor bonding layer.

17. The method of claim 11, wherein forming the bonding layer includes forming a first bonding layer portion on the device wafer and forming a second bonding layer portion on the second substrate, the method further comprising:

forming a semiconductor bonding layer on one of the first bonding layer portion or the second bonding layer portion.

18. The method of claim 11, wherein forming the bonding layer includes forming a first bonding layer portion on the device wafer and forming a second bonding layer portion on the second substrate, the method further comprising:

forming a first semiconductor bonding layer on the first bonding layer portion; and forming a second semiconductor bonding layer on the second bonding layer portion.

19. A method, comprising:

forming a bonding layer on a device wafer, the bonding layer having a thickness less than 3000 nm and a thermal conductivity greater than 10 W/m-K;

forming a second dielectric layer on a carrier substrate, the second dielectric layer formed of a different material than the bonding layer;

bonding the bonding layer of the device wafer to the second dielectric layer of the carrier substrate;

forming a thinned backside by thinning a backside of the device wafer;

forming a backside interconnect structure on the thinned backside; and forming one or more electrical contacts on the backside interconnect structure.

20. The method of claim 19, further comprising:

forming a third dielectric layer on the device wafer, wherein forming the bonding layer includes forming the bonding layer directly on the third dielectric layer, wherein the third dielectric layer is formed of a different material than the second dielectric layer.

21. The method of claim 19, wherein the bonding layer is in direct contact with the second dielectric layer.

* * * * *